United States Patent

Hironaka

[11] Patent Number: 5,568,502
[45] Date of Patent: Oct. 22, 1996

[54] SEMICONDUCTOR LASER DEVICE

[75] Inventor: Misao Hironaka, Itami, Japan

[73] Assignee: Mitsubishi Denki Kabushiki Kaisha, Tokyo, Japan

[21] Appl. No.: 513,390

[22] Filed: Aug. 10, 1995

[30] Foreign Application Priority Data

Aug. 22, 1994 [JP] Japan .................................. 6-196754
Jun. 15, 1995 [JP] Japan .................................. 7-148732

[51] Int. Cl.$^6$ ...................................................... H01S 3/19
[52] U.S. Cl. ............................................ 372/50; 372/46
[58] Field of Search ................................ 372/50, 45, 46

[56] References Cited

U.S. PATENT DOCUMENTS

| | | | |
|---|---|---|---|
| 5,404,370 | 4/1995 | Otsubo et al. | 372/46 |
| 5,422,904 | 6/1995 | Gorfinkel et al. | 372/50 |
| 5,424,559 | 6/1995 | Kasahara | 372/50 |

FOREIGN PATENT DOCUMENTS

| | | |
|---|---|---|
| 61-220383 | 9/1986 | Japan . |
| 62-15872 | 1/1987 | Japan . |
| 63-95690 | 4/1988 | Japan . |
| 4163983 | 6/1992 | Japan . |
| 5251828 | 9/1993 | Japan . |
| 5299779 | 11/1993 | Japan . |

OTHER PUBLICATIONS

Tanigami et al, "Micro Collimated Beam Using Laser Diode Integrated With Micro Fresnel Lens", The Japan Society of Applied Physics, 1988, p. 858.

Sugimoto et al, "Integration Of 1.5 μm InGaAsP/InP Lasers With A Photodiode Using $C_2H_6/H_2$ RIE", The Japan Society of Applied Physics, 1989, p. 938.

Komazaki et al, "Small Astigmatism, High Power And Low Noise 0.78 μm Self-Aligned Lasers", Electronics Letters, vol. 25, No. 4, 1989, pp. 295–296.

*Primary Examiner*—James W. Davie
*Attorney, Agent, or Firm*—Leydig, Voit & Mayer

[57] ABSTRACT

A semiconductor laser device includes resonator facets formed by cleaving; a first conductivity type semiconductor region; a semiconductor multilayer structure disposed on the first conductivity type semiconductor region and including at least an active layer and upper and lower cladding layers sandwiching the active layer, the semiconductor multilayer structure functioning as a laser; first and second electrodes for supplying current to the semiconductor multilayer structure to generate light in that structure; a second conductivity type semiconductor region disposed in the vicinity of the semiconductor multilayer structure so that the light generated in the semiconductor multilayer structure is directly applied to the second conductivity type region, the second conductivity type region contacting the first conductivity type semiconductor region to produce a pn junction; and a third electrode electrically contacting the second conductivity type region for outputting signals when a voltage is applied across the third electrode and one of the first and second electrodes. Since the light-responsive region, i.e., the pn junction, is included in the laser device, an external photodetector is dispensed with, so the cost of the laser device is significantly reduced.

10 Claims, 9 Drawing Sheets

SEMICONDUCTOR LASER DEVICE

FIELD OF THE INVENTION

The present invention relates to semiconductor laser devices and, more particularly, to a semiconductor laser device including a photodetector for monitoring intensity of laser light emitted from the laser device.

BACKGROUND OF THE INVENTION

FIG. 6 is a schematic diagram illustrating a prior art semiconductor laser device. In FIG. 6, reference numeral 101 designates a heat sink. A laser element 102 emitting laser light is mounted on a part of the heat sink 101. A photodetector 103 for monitoring the intensity of the laser light is disposed on a part of the heat sink 101 spaced from the laser element 102. Reference numerals 104, 105, and 106 designate voltage applying terminals. When a voltage sufficient to operate the laser element is applied across the terminals 104 and 105, laser light beam 107 and 108 are emitted from opposite facets of the laser. The laser element 102 and the photodetector 103 are positioned so that the photodetector 103 is irradiated with laser light beam 108. When a voltage sufficient to operate the photodiode 103 is applied across the terminals 104 and 106, current flowing through the photodetector 103 is measured, whereby the intensity of the laser light 108 from the laser element 102 is monitored and, synchronously, the intensity of the laser light 107 is monitored indirectly.

FIG. 7 is a sectional view of the laser element 102 shown in FIG. 6, illustrating the laser light emitting facet. In FIG. 7, reference numeral 1 designates an n type GaAs substrate. An n type AlGaAs lower cladding layer 2 is disposed on the GaAs substrate 1. A p type AlGaAs active layer 3 is disposed on the lower cladding layer 2. A p type AlGaAs upper cladding layer 4 is disposed on the active layer 3. The upper cladding layer 4 has a stripe-shaped ridge 6 serving as a current path in the center of the structure. N type GaAs current blocking layers 5 are disposed on the upper cladding layer 4, contacting the opposite sides of the ridge 6. A p type GaAs contact layer 7 is disposed on the current blocking layer 5 and on the stripe-shaped ridge 6. An anode electrode 9 is disposed on the contact layer 7, and a cathode electrode 10 is disposed on the rear surface of the substrate 1.

A description is given of the operation.

When a plus voltage is applied to the anode electrode 9 and a minus voltage is applied to the cathode electrode 10, since the pn junction between the active layer 3 and the lower cladding layer 2 is biased in the forward direction, a forward current flows toward the pn junction. The current is concentrated in the ridge structure 6 by the current blocking layers 5. In FIG. 7, arrows 13 show the current flow. Therefore, the current is concentrated in a central region of the active layer 3 directly under the ridge 6, and laser oscillation occurs in that region. A dotted circle 14 shows a spatial distribution of laser light. A part of the laser light reaches the GaAs current blocking layer 5 and is absorbed because the band gap energy of the GaAs current blocking layer 5 is smaller than the band gap energy of the AlGaAs active layer 3. As a result, laser oscillation occurs in a transverse mode that is parallel with the active layer 3, i.e., that is stable in the horizontal direction.

In the laser device show in FIGS. 6 and 7, since the external photodetector 103 is necessary for monitoring the intensity of laser light emitted from the laser element 102, the cost of assembling of the photodetector 103 is considerable.

SUMMARY OF THE INVENTION

It is an object of the present invention to provide a semiconductor laser device containing a photodetector, thereby reducing the cost for assembling the photodetector, Other objects and advantages of the invention will become apparent from the detailed description that follows, The detailed description and specific embodiments described are provided only for illustration since various additions and modifications within the scope of the invention will be apparent to those of skill in the art from the detailed description.

According to a first aspect of the present invention, a semiconductor laser device comprises opposite resonator facets formed by cleaving; a first conductivity type semiconductor region; a semiconductor multilayer structure disposed on the first conductivity type semiconductor region and comprising at least an active layer and upper and lower cladding layers sandwiching the active layer, which semiconductor multilayer structure functions as a laser; first and second electrodes for supplying current to the semiconductor multilayer structure to generate light in that structure; a second conductivity type semiconductor region disposed in the vicinity of the semiconductor multilayer structure so that the light generated in the semiconductor multilayer structure is directly applied to the second conductivity type region, and contacting the first conductivity type semiconductor region to produce a pn junction; and a third electrode electrically contacting the second conductivity type region and capable of outputting signals when a voltage is applied across the third electrode and one of the first and second electrodes.

According to a second aspect of the present invention, in the above-described semiconductor laser device, the first conductivity type region is a first conductivity type semiconductor substrate having opposite first and second surfaces, the semiconductor multilayer structure functioning as a laser is disposed on the first surface of the first conductivity type semiconductor substrate, the second conductivity type region is disposed within the first conductivity type semiconductor substrate, reaching the second surface of the substrate, and the first conductivity type semiconductor substrate and the second conductivity type region produce a pn junction perpendicular to the laser light emitting direction.

According to a third aspect of the present invention, in the above-described semiconductor laser device, the second conductivity type region is a second conductivity type semiconductor substrate having opposite first and second surfaces, the first conductivity type region comprises a first conductivity type light absorption layer disposed on the first surface of the semiconductor substrate and a first conductivity type buffer layer disposed on the light absorption layer, the semiconductor multilayer structure is disposed on the buffer layer, one of the first and second electrodes is disposed on the buffer layer at the surface where the light absorption layer is present, on opposite sides of and spaced apart from the light absorption layer, and the third electrode is disposed on the second surface of the second conductivity type semiconductor substrate.

According to a fourth aspect of the present invention, the above-described semiconductor laser device further includes a second conductivity type semiconductor substrate having opposite first and second surfaces, and the semiconductor multilayer structure is disposed on the first surface of the second conductivity type semiconductor substrate. The first conductivity type region is a first conductivity type contact layer disposed on the semiconductor multilayer structure, and the second conductivity type region is disposed within the first conductivity type contact layer, reaching the surface of the contact layer, whereby a pn junction perpendicular to the laser light emitting direction is produced between the first conductivity type contact layer and the second conductivity type region.

According to a fifth aspect of the present invention, the above-described semiconductor laser device further includes a second conductivity type semiconductor substrate having opposite first and second surfaces, and the semiconductor multilayer structure is disposed on the first surface of the second conductivity type semiconductor substrate. The first conductivity type region comprises a first conductivity type first contact layer disposed on the semiconductor multilayer structure and a first conductivity type light absorption layer disposed on a center region of the first contact layer, and the second conductivity type region comprises a second conductivity type second contact layer disposed on the first conductivity type light absorption layer, whereby a pn junction is produced between the first conductivity type light absorption layer and the second conductivity type second contact layer. The first electrode is disposed on the second surface of the second conductivity type semiconductor substrate, the second electrode is disposed on the first conductivity type first contact layer at opposite sides of and spaced apart from the light absorption layer, and the third electrode is disposed on the second conductivity type second contact layer.

According to a sixth aspect of the present invention, a semiconductor laser device comprises a semiconductor substrate of a first conductivity type having opposite first and second surfaces, a laser structure disposed on a center region of the first surface of the semiconductor substrate, and photodetectors disposed on the first surface of the semiconductor substrate at the opposite sides of and spaced apart from the laser structure. The laser structure comprises an active region comprising a first conductivity type lower cladding layer, a second conductivity type active layer, and a second conductivity type upper cladding layer, first conductivity type current blocking layers for concentrating current in the active region, and a second conductivity type contact layer disposed on the active region and on the current blocking layers. Each of the photodetectors comprises a first conductivity type lower cladding layer, a second conductivity type active layer, a second conductivity type upper cladding layer, and a second conductivity type contact layer, wherein a pn junction is produced between the lower cladding layer and the active layer. The n type AlGaAs lower cladding layer, p type AlGaAs active layer, p type AlGaAs upper cladding layer, and p type GaAs contact layer included in the laser structure are grown synchronously with those layers included in the photodetectors.

In the above-described laser structures according to the present invention, since the photodetector region is included in the laser device, an external photodetector and an assembling process therefor are dispensed with, whereby the cost of the laser device is significantly reduced.

DETAILED DESCRIPTION OF THE PREFERRED EMBODIMENTS

Embodiment 1

Figure 1:
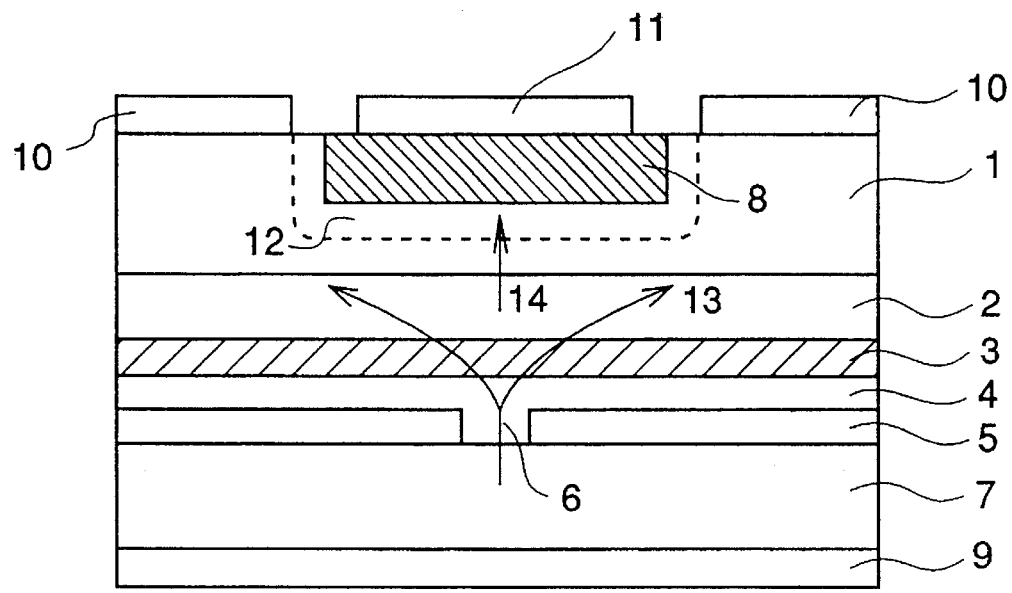
FIG. 1 is a sectional view illustrating a semiconductor laser device in accordance with a first embodiment of the present invention.
Figure 7:
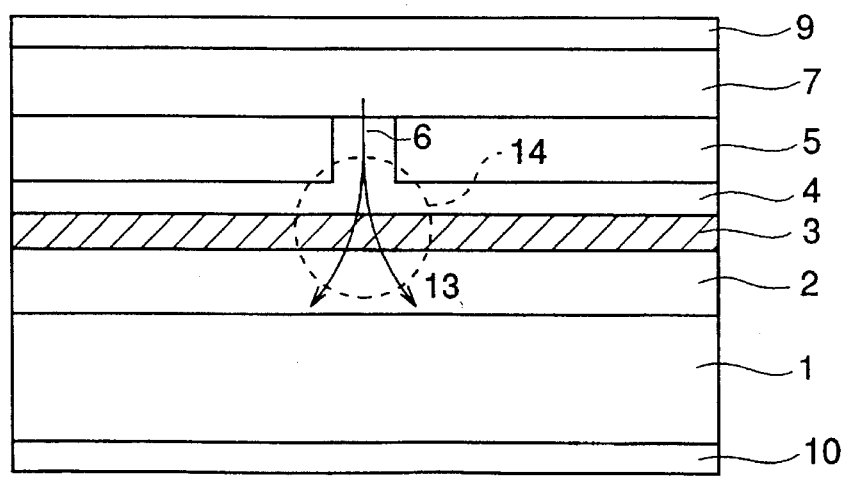
FIG. 7 is a sectional view illustrating a laser element according to the prior art.

FIG. 1 is a sectional view illustrating a semiconductor laser device in accordance with a first embodiment of the present invention. In FIG. 1, the same reference numerals as in FIG. 7 designate the same or corresponding parts.

The laser structure shown in FIG. 1 includes an n type GaAs substrate 1 having opposite first and second surfaces. The substrate 1 has a carrier concentration of about $1 \times 10^{19}$ cm$^{-3}$ and a thickness of about 90 µm. An n type AlGaAs lower cladding layer 2 having a carrier concentration of about $3 \times 10^{18}$ cm$^{-3}$, a thickness of about 1.5 µm, and an Al composition ratio of about 0.5 is disposed on the first surface of the GaAs substrate 1. A p type AlGaAs active layer 3 having a carrier concentration of about $2 \times 10^{18}$ cm$^{-3}$, a thickness of about 0.08 µm, and an Al composition ratio of about 0.15 is disposed on the lower cladding layer 2. A p type AlGaAs upper cladding layer 4 having a carrier concentration of about $2 \times 10^{18}$ cm$^{-3}$, a thickness of about 1.2 µm, and an Al composition ratio of about 0.5 is disposed on the active layer 3. The upper cladding layer 4 has a stripe-shaped ridge 6 serving as a current path in the center of the structure. The ridge 6 is produced by selective etching of the upper cladding layer 4 using a stripe-shaped mask, leaving about 0.2 μm thick portions at the opposite sides of the ridge 6. The width of the ridge 6 is about 3 μm. N type GaAs current blocking layers 5 are disposed on the 0.2 μm thick portions of the upper cladding layer 4, contacting the opposite sides of the ridge 6. The current blocking layers 5 have a carrier concentration of about $1\times10^{19}$ cm$^{-3}$ and a thickness of about 1 μm. A p type GaAs contact layer 7 having a carrier concentration of about $1\times10^{19}$ cm$^{-3}$ and a thickness of about 3 μm is disposed on the current blocking layer 5 and on the stripe-shaped ridge 6. A p type GaAs region 8 is formed within the n type GaAs substrate 1, reaching the second surface of the substrate 1. A light responsive electrode 11 is disposed on the second surface of the substrate 1, contacting the p type GaAs region 8. The p type GaAs region 8 is formed by adding a p type dopant to the n type GaAs substrate 1 using ion implantation or diffusion. The region 8 is about 90 μm deep and 3~10 μm wide. The light responsive electrode 11 comprises AuZn or a Ti based alloy and has a thickness of 5000~10000 Å. Cathode electrodes 10 comprising AuGe and having a thickness of 5000~10000 Å are disposed on the second surface of the substrate 1 at opposite sides of and spaced apart from the p type GaAs region 8. An anode electrode 9 comprising AuZn or a Ti base alloy and having a thickness of 5000~10000 Å is disposed on the p type GaAs contact layer 7. A depletion layer 12 is produced between the p type GaAs region 8 and the n type GaAs substrate 1 when a reverse bias is applied across the region 8 and the substrate 1. The space between the depletion layer 12 and the lower cladding layer 2 is less than 0.5 μm.

A description is given of the fabrication process.

Initially, the n type AlGaAs lower cladding layer 2, the p type AlGaAs active layer 3, and the p type AlGaAs upper cladding layer 4 are successively epitaxially grown on the n type GaAs substrate 1 by MOCVD (Metal Organic Chemical Vapor Deposition) or MBE (Molecular Beam Epitaxy).

Thereafter, the upper cladding layer 4 is selectively etched to form the stripe-shaped ridge 6, leaving about 0.2 μm thick portions at both sides of the ridge 6. The n type GaAs current blocking layer 5 is epitaxially grown on the 0.2 μm thick portions of the cladding layer 4, contacting both sides of the ridge 6.

Then, the p type GaAs contact layer 7 is grown on the current blocking layer 5 and the ridge 6 by MOCVD or MBE.

Thereafter, a p type dopant, such as Zn, is added to a center region of the n type GaAs substrate 1 from the second surface of the substrate 1 by ion implantation or diffusion to invert the conductivity type in that region, thereby forming the p type GaAs region 8.

To complete the laser structure shown in FIG. 1, the n side (cathode) electrodes 10 are formed on the second surface of the n type GaAs substrate 1 at positions on opposite sides of and spaced apart from the p type GaAs region 8, the p side (anode) electrode 9 is formed on the p type GaAs contact layer 7, and the p side (light responsive) electrode 11 is formed contacting the p type GaAs region 8.

A description is given of the operation.

When a forward bias is applied across the anode electrode 9 and the cathode electrodes 10, a forward current flows as shown by arrows 13, and laser oscillation occurs. By controlling the voltage applied to the light responsive electrode 11 so that it does not exceed the voltage applied to the cathode electrodes 10, a reverse bias is applied to the pn junction between the p type GaAs region 8 and the n type GaAs substrate 1, and the depletion layer 12 is produced in a region adjacent to the pn junction. In this case, current hardly flows between the light responsive electrode 11 and the cathode electrodes 10. However, during laser operation, since laser light produced in the active layer 3 has a spatial distribution, leakage light shown by an arrow 14 reaches into the depletion layer 12. The leakage light 14 is absorbed in the depletion layer 12 and converted into a photocurrent due to photon to electron-hole pair conversion. Thereby, the amount of the photocurrent in proportion to the amount of the leakage light 14 is detected by the light responsive electrode 11. Since the amount of the leakage light 14 depends on the output intensity of the laser light, the output intensity of the laser light can be monitored by detecting the photocurrent from the light responsive electrode 11.

While in the above-described first embodiment of the invention the carrier concentration of the n type GaAs substrate 1 is about $1\times10^{19}$ cm$^{-3}$, it may be reduced to for example, about $1\times10^{17}$ cm$^{-3}$, as long as the contact resistance between the cathode electrodes 10 and the GaAs substrate 1 does not exceed $1\times10^{-3}$ Ωcm$^{-2}$.

Although emphasis has been placed upon a laser structure including an n type GaAs substrate in the foregoing description, a similar structure including a p type GaAs substrate and semiconductor layers and regions of conductivity types opposite to those described above is also within the scope of the present invention.

According to the first embodiment of the present invention, since a photodetector is incorporated in a laser device, an external photodetector can be dispensed with. Since the fabrication of the photodetector in the laser structure is easier and cheaper than assembling an external photodetector, the cost of the device is significantly reduced.

Embodiment 2

Figure 2:
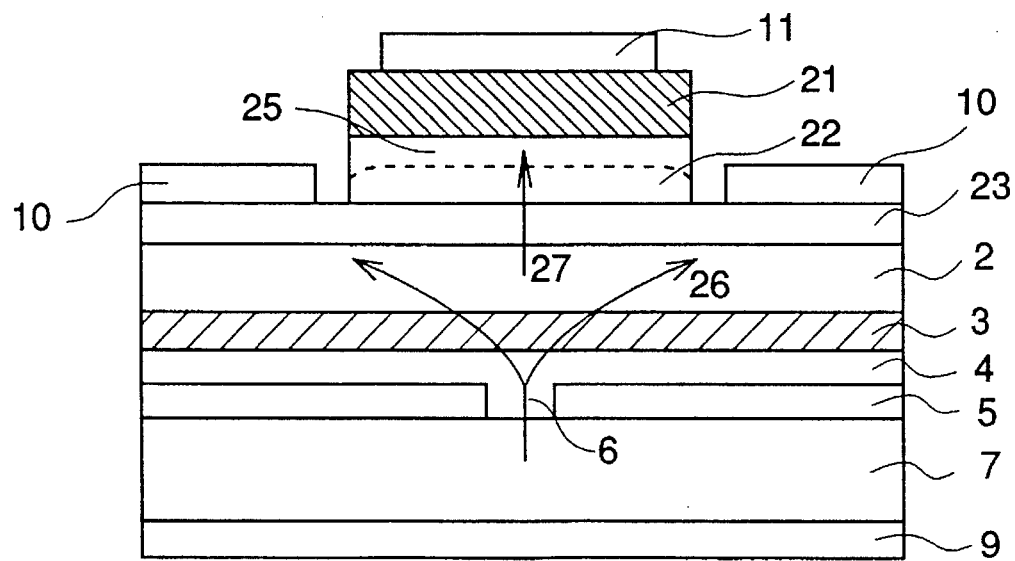
FIG. 2 is a sectional view illustrating a semiconductor laser device in accordance with a second embodiment of the present invention.

FIG. 2 is a sectional view illustrating a semiconductor laser device in accordance with a second embodiment of the present invention. In the figure, the same reference numerals as in FIG. 1 designate the same or corresponding parts. While in the above-described first embodiment the p type GaAs region 8 functioning as a light responsive region is produced within the n type GaAs substrate 1 by ion implantation or diffusion, in this second embodiment a p type GaAs substrate itself functions as a light responsive region.

More specifically, the laser structure shown in FIG. 2 includes a p type GaAs substrate 21 having opposite first and second surfaces. The p type GaAs substrate 21 has a carrier concentration of $1\times10^{16}$~$1\times10^{20}$ cm$^{-3}$ and a thickness of about 90 μm. An n type GaAs light absorption layer 22 having a carrier concentration of $1\times10^{14}$~$1\times10^{18}$ cm$^{-3}$ and a thickness of 1~5 μm is disposed on the first surface of the GaAs substrate 21. A light responsive electrode 11 is disposed on the second surface of the GaAs substrate 21. An n type GaAs buffer layer 23 having a carrier concentration of $1\times10^{18}$~$1\times10^{20}$ cm$^{-3}$ and a thickness of 1~2 μm is disposed between the light absorption layer 22 and the n type AlGaAs lower cladding layer 2. Cathode electrodes 10 are disposed on the n type GaAs buffer layer 23 at opposite sides of and spaced apart from the light absorption layer 22. A depletion layer 25 is produced within the light absorption layer 22 when a reverse bias is applied to the pn junction between the p type GaAs substrate 21 and the n type GaAs light absorption layer 22.

A description is given of the fabrication process.

Initially, the n type GaAs light absorption layer 22, the n type GaAs buffer layer 23, the n type AlGaAs lower cladding layer 2, the p type AlGaAs active layer 3, and the p type AlGaAs upper cladding layer 4 are successively epitaxially grown on the first surface of the p type GaAs substrate 21 by MOCVD or MBE.

Thereafter, the upper cladding layer 4 is selectively etched to form the stripe-shaped ridge 6 in the center of the structure, followed by epitaxial growth of the n type GaAs current blocking layer 5 on the cladding layer 4 contacting both sides of the ridge 6.

Then, the p type GaAs contact layer 7 is grown on the current blocking layer 5 and the ridge 6 by MOCVD or MBE.

Thereafter, a center region of the second surface of the p type GaAs substrate 21 is masked, and the p type GaAs substrate 21 and the n type GaAs light absorption layer 22 are selectively etched until the n type GaAs buffer layer 23 is exposed.

To complete the laser structure shown in FIG. 2, the n side electrodes 10 are formed on the exposed surface of the buffer layer 23 at opposite sides of and spaced apart from the light absorption layer 22, and the p side electrodes 9 and 11 are formed on the contact layer 7 and on the p type GaAs substrate 21, respectively.

A description is given of the operation.

When a reverse bias is applied across the light responsive electrode 11 and the cathode electrodes 10, the depletion layer 25 is produced in the light absorption layer 22 having a relatively low carrier concentration. When a forward bias is applied across the anode electrode 9 and the cathode electrodes 10, a forward current flows across the active layer 3 as shown by arrows 26, thereby producing laser light. Since the laser light has a spatial distribution, a leakage light shown by an arrow 27 reaches the depletion layer 25, and a photocurrent is detected from the light responsive electrode 11 as described in the first embodiment of the invention, whereby the intensity of the emitted laser light is monitored.

In the above-described first embodiment of the invention, since the carrier concentration of the n type GaAs substrate is as high as $10^{19}$ cm$^{-3}$, the extension of the depletion layer is suppressed and the sensitivity is not very good. However, in this second embodiment of the invention, since the light absorption layer 22 having a relatively low carrier concentration, i.e., $1\times10^{14}$~$1\times10^{18}$ cm$^{-3}$, is inserted between the buffer layer 23 and the p type GaAs substrate 21, the depletion layer extends relatively far and sensitivity is improved.

Although in the second embodiment emphasis has been placed upon a laser structure including a p type GaAs substrate, a similar structure including an n type GaAs substrate and semiconductor layers and regions of conductivity types opposite to those described above is also within the scope of the present invention.

As described above, according to the second embodiment of the invention, since a photodetector is incorporated in a laser device, an external photodetector and an assembling of the external photodetector are dispensed with. Although the crystal growth and selective etching of the p type GaAs substrate 21 and the n type GaAs light absorption layer 22 are added, since these process steps are easier and cheaper than as assembling an external photodetector, the cost of the laser device is significantly reduced.

Embodiment 3

Figure 3:
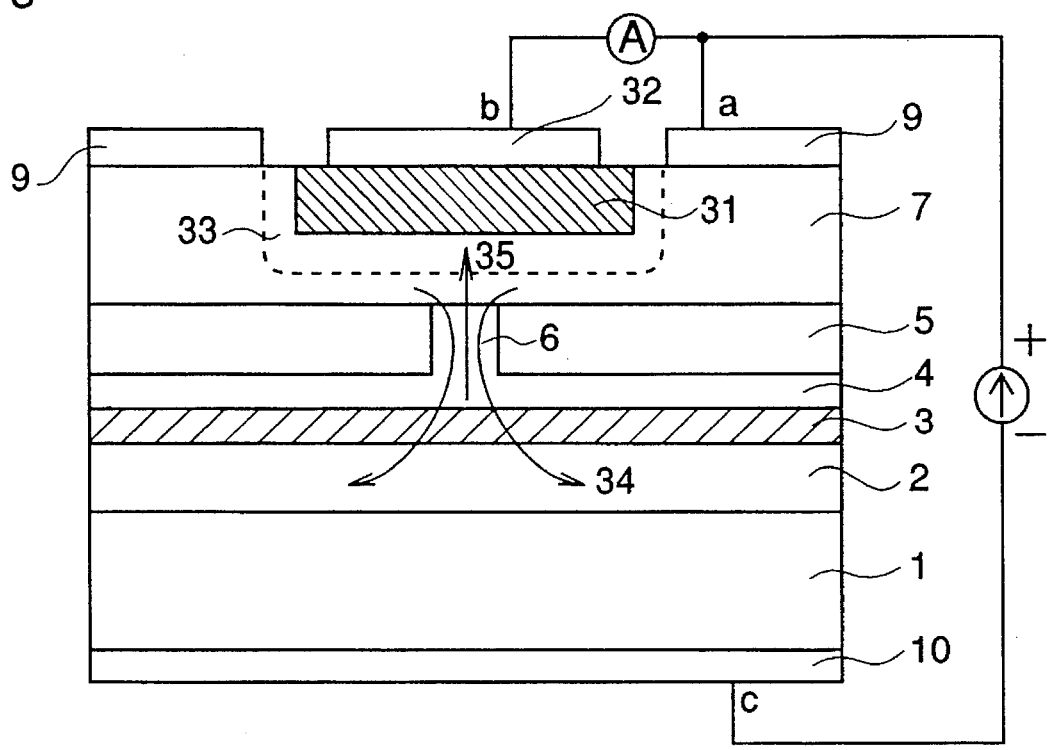
FIG. 3 is a sectional view illustrating a semiconductor laser device in accordance with a third embodiment of the present invention.

FIG. 3 is a sectional view illustrating a semiconductor laser device in accordance with a third embodiment of the present invention. In FIG. 3, the same reference numerals as in FIG. 1 designate the same or corresponding parts. The laser structure according to this third embodiment is fundamentally identical to the laser structure according to the first embodiment except that an n type GaAs region 31 functioning as a light responsive region is formed within the p type GaAs contact layer 7 at the front surface of the contact layer 7 whereas the p type GaAs light responsive region 8 is formed within the n type GaAs substrate 1 in the first embodiment of the invention.

More specifically, the n type GaAs region 31 is formed within the p type GaAs contact layer 7 by adding an n type dopant to the contact layer 7 from the front surface using ion implantation or diffusion. A light responsive electrode 32 comprising AuGe base metal is disposed on the contact layer 7, contacting the n type GaAs region 31. A depletion layer 33 is produced between the n type GaAs region 31 and the p type GaAs contact layer 7 when a reverse bias is applied.

A description is given of the fabrication process.

The process steps until the epitaxial growth of the p type GaAs contact layer 7 are identical to those already described with respect to the first embodiment of the invention and, therefore, do not require repeated description.

After the epitaxial growth of the p type GaAs contact layer 7, an n type dopant is added to a center region of the contact layer 7 by ion implantation or diffusion to form the n type GaAs region 31.

Thereafter, the p side electrodes 9 comprising AuZn or Ti based alloy are formed on the surface of the contact layer 7 at positions on opposite sides of and spaced apart from the n type GaAs region 31. Further, the n side electrode 10 comprising AuGe is formed on the rear surface of the n type GaAs substrate 1, and the n side electrode 32 comprising AuGe base metal is formed in contact with the n type GaAs region 31, completing the laser structure shown in FIG. 3.

A description is given of the operation.

When a reverse bias is applied across the light responsive electrode 32 and the anode electrodes 9, the depletion layer 33 is produced in a region adjacent to the pn junction between the p type GaAs contact layer 7 and the n type GaAs region 31. When a forward bias is applied across the anode electrodes 9 and the cathode electrode 10, a forward current flows across the active layer 3 as shown by arrows 34, thereby generating laser light. Since the laser light has a spatial distribution, a portion of the laser light leaks as shown by an arrow 35 and reaches the depletion layer 33. Therefore, as described in the first embodiment of the invention, a photocurrent is detected from the light responsive electrode 32, whereby the intensity of the emitted laser light is monitored.

Although the carrier concentration of the p type GaAs contact layer 7 is about $1\times10^{19}$ cm$^{-3}$, it may be reduced to, for example, $1\times10^{17}$ cm$^{-3}$ as long as the contact resistance between the anode electrodes 9 and the contact layer 7 does not exceed $1\times10^{-3}$ $\Omega$cm$^{-2}$.

Although in this third embodiment emphasis has been placed upon a laser structure including an n type GaAs substrate, a similar structure including a p type GaAs substrate and semiconductor layers and regions of conductivity types opposite to those described above is also within the scope of the present invention.

According to the third embodiment of the present invention, since a photodetector is incorporated in a laser device, an external photodetector can be dispensed with. Since the fabrication of the photodetector in the laser structure is easier and cheaper than assembling an external photodetector, the cost of the device is significantly reduced.

Embodiment 4

Figure 4:
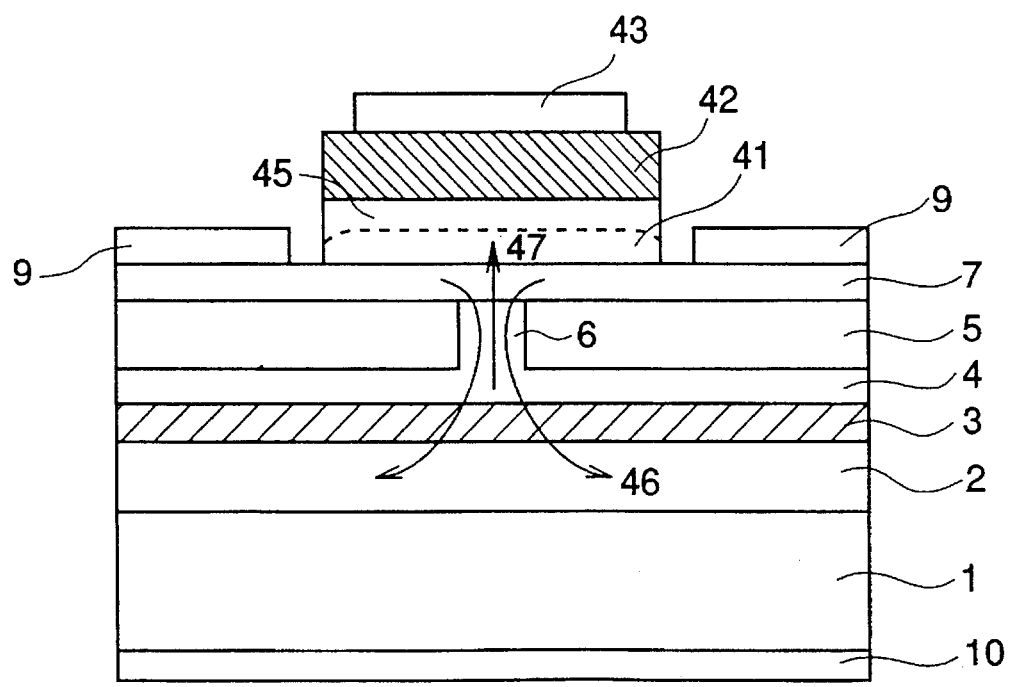
FIG. 4 is a sectional view illustrating a semiconductor laser device in accordance with a fourth embodiment of the present invention.

FIG. 4 is a sectional view illustrating a semiconductor laser device in accordance with a fourth embodiment of the present invention. In the figure, the same reference numerals as in FIG. 3 designate the same or corresponding parts. While in the above-described third embodiment the n type GaAs region 31 functioning as a light responsive region is formed within the p type GaAs contact layer 7 by ion implantation or diffusion, in this fourth embodiment an n type GaAs contact layer 42 functioning as a light responsive region and a p type GaAs light absorption layer 41 are disposed on the p type GaAs contact layer 7.

More specifically, a p type GaAs light absorption layer 41 having a carrier concentration of $1\times10^{14} \sim 1\times10^{18}$ cm$^{-3}$ and a thickness of 1~5 μm is disposed on a center part of the p type GaAs contact layer 7. An n type GaAs contact layer 42 having a carrier concentration of $1\times10^{18} \sim 1\times10^{20}$ cm$^{-3}$ is disposed on the light absorption layer 41. A light responsive electrode 43 comprising AuGe base metal is disposed on the n type GaAs contact layer 42. Anode electrodes 9 are disposed on the contact layer 7 at positions on opposite sides of and spaced apart from the light absorption layer 41. A depletion layer 45 is produced within the light absorption layer 41 contacting the n type contact layer 42 when a reverse bias is applied.

A description is given of the fabrication process.

The process steps until the epitaxial growth of the n type GaAs current blocking layer 5 are identical to those already described with respect to the first embodiment of the invention and, therefore, do not require repeated description.

After the growth of the n type GaAs current blocking layer 5, the p type GaAs contact layer 7, the p type GaAs light absorption layer 41, and the n type GaAs contact layer 42 are successively grown on the current blocking layer 5 and the ridge 6, preferably by MOCVD.

Thereafter, a mask pattern is formed on a center region of the n type GaAs contact layer 42, and the n type GaAs contact layer 42 and the p type GaAs light absorption layer 41 are selectively etched until the p type GaAs contact layer 7 is exposed. Then, the p side electrodes 9 comprising AuZn or a Ti base alloy are formed on the exposed surface of the contact layer 7 at positions on opposite sides of and spaced apart from the light absorption layer 41. Further, the n side electrode 10 and the light responsive n side electrode 43, both comprising AuGe base metal are formed on the rear surface of the n type GaAs substrate 1 and on the n type GaAs contact layer 42, respectively, completing the laser structure shown in FIG. 4.

A description is given of the operation.

When a reverse bias is applied across the light responsive electrode 43 and the anode electrodes 9, the depletion layer 45 is produced within the light absorption layer 41 having a relatively low carrier concentration. When a forward bias is applied across the anode electrodes 9 and the cathode electrode 10, a forward current flows across the active layer 3 as shown by arrows 46, and laser light is generated in the active layer 3. A portion of the laser light leaks as shown by an arrow 47 and reaches the depletion layer 45, and a photocurrent is detected from the light responsive electrode 43 as described in the first embodiment of the invention. In this way, the intensity of the emitted laser light is monitored.

Although in this fourth embodiment emphasis has been placed upon a laser structure including an n type GaAs substrate, a similar structure including a p type GaAs substrate and semiconductor layers and regions of conductivity types opposite to those described above is also within the scope of the present invention.

According to the fourth embodiment of the present invention, since a photodetector is incorporated in a laser device, an external photodetector can be dispensed with. Since the fabrication of the photodetector in the laser structure is easier and cheaper than assembling an external photodetector, the cost of the device is significantly reduced.

Embodiment 5

Figure 5:
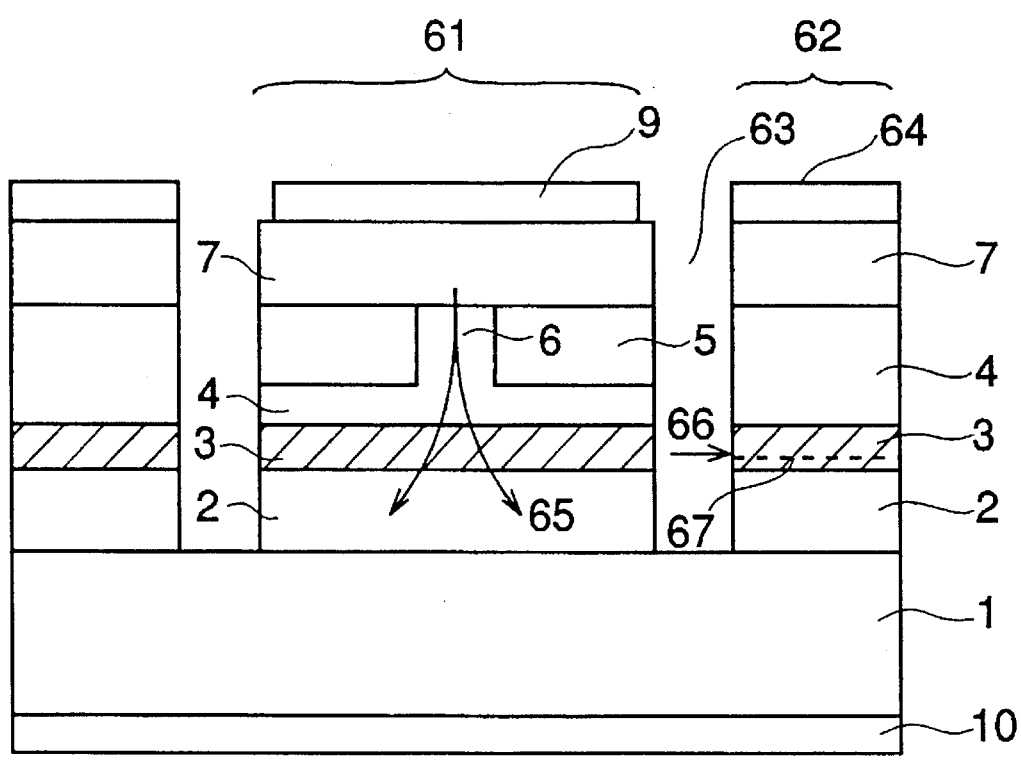
FIG. 5 is a sectional view illustrating a semiconductor laser device in accordance with a fifth embodiment of the present invention.
Figure 6:
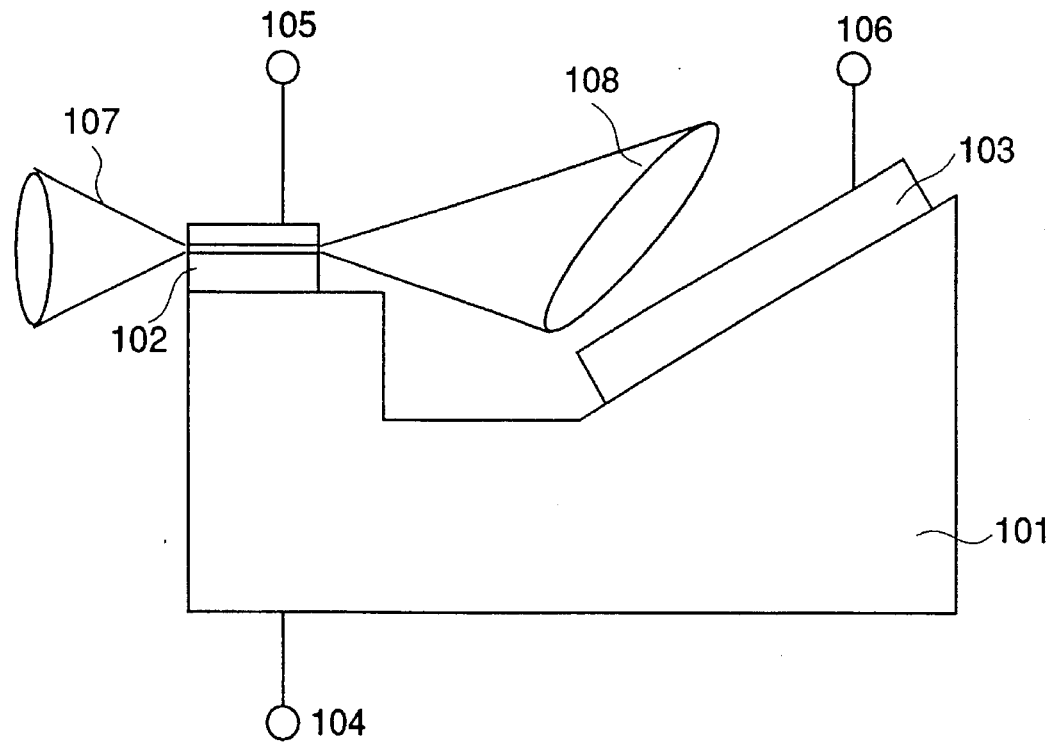
FIG. 6 is a schematic side view illustrating a laser device according to the prior art.

FIG. 5 is a sectional view illustrating a semiconductor laser device in accordance with a fifth embodiment of the present invention. In the figure, the same reference numerals as in FIG. 1 designate the same or corresponding parts.

The laser structure shown in FIG. 5 includes a laser region 61 and two photodetector regions 62 disposed on opposite sides of and spaced apart from the laser region 61. More specifically, isolation grooves 63 penetrating through the semiconductor multilayer structure on the substrate 1 electrically isolate the laser region 61 from the photodetector regions 62. The laser region 61 comprises the cathode electrode 10, the substrate 1, the semiconductor layers 2 to 7, and the anode electrode 9. The photodetector region 62 comprises the cathode electrode 10, the substrate 1, the semiconductor layers 2, 3, 4, and 7, and a light responsive electrode 64.

A description is given of the fabrication process.

Initially, the n type AlGaAs lower cladding layer 2, the p type AlGaAs active layer 3, and the p type AlGaAs upper cladding layer 4 are successively epitaxially grown on the GaAs substrate 1. Then, the upper cladding layer 4 in a prescribed center region is selectively etched to form the ridge 6 so that about 0.2 μm thick portions are left on both sides of the ridge 6, followed by selective growth of the current blocking layer 5 on the 0.2 μm thick portions of the upper cladding layer 4.

Thereafter, the p type GaAs contact layer 7 is grown on the ridge 6, on the current blocking layer 5, and on the upper cladding layer 4, preferably by MOCVD or MBE.

Then, a resist film is deposited on the contact layer 7 and patterned to form stripe-shaped openings at opposite regions of the contact layer 7 where the isolation grooves 63 are to be formed. Using the resist film as a mask, the structure is etched until the substrate 1 is exposed to form the isolation grooves 63.

To complete the laser structure shown in FIG. 5, a p side electrode 9 is formed on the p type GaAs contact layer 7 in the laser region 61 between the isolation grooves 63, and light responsive p side electrodes 64 are formed on the p type GaAs contact layer 7 in the photodetector regions 62 outside the isolation grooves 63, and an n side electrode 10 is formed on the rear surface of the n type GaAs substrate 1.

A description is given of the operation.

When a reverse bias is applied across the light responsive electrodes 64 and the cathode electrode 10, the depletion layer 67 is produced in the active layer 3 at the pn junction between the active layer 3 and the lower cladding layer 2. When a forward bias is applied across the anode electrode 9 and the cathode electrode 10, a forward current flows across the active layer 3 as shown by arrows 65, and laser light is generated in the active layer 3. A portion of the laser light leaks and reaches the depletion layer 67 as shown by an arrow 67 66, and a photocurrent is detected from the light responsive electrode 64 as described in the first embodiment of the invention. In this way, the intensity of the emitted laser light is monitored.

Although in this fifth embodiment emphasis has been placed upon a laser structure including an n type GaAs substrate, a similar structure including a p type GaAs substrate and semiconductor layers and regions of conductivity types opposite to those described above is also within the scope of the present invention.

Meanwhile, prior art semiconductor laser devices in which light responsive elements are incorporated in light emitting elements have been disclosed in Japanese Published Patent Applications Nos. Sho. 63-95690, Hei. 4-163983, Sho. 61-220383, Hei. 5-251828, Hei. 5-299779, and Sho. 62-15872.

Hereinafter, differences between the laser devices according to the above-described prior lasers and laser devices according to the first to fifth embodiments of the present invention will be described in detail.

Figure 8:
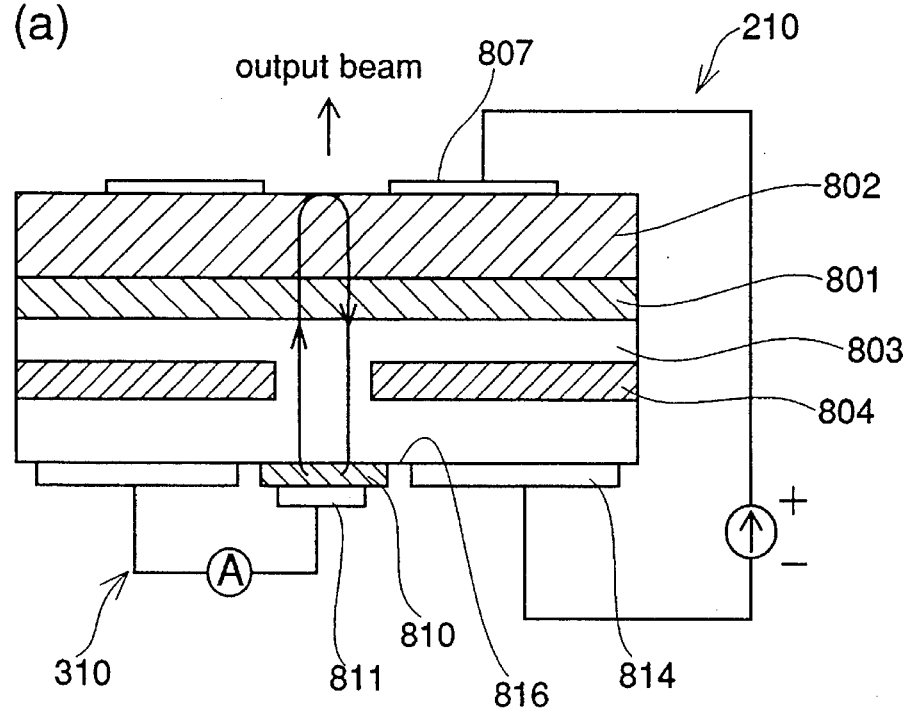
FIGS. 8(a) and 8(b) are sectional views illustrating prior art laser devices disclosed in Japanese Published Patent Application No. Sho. 63-95690.
Figure 8:
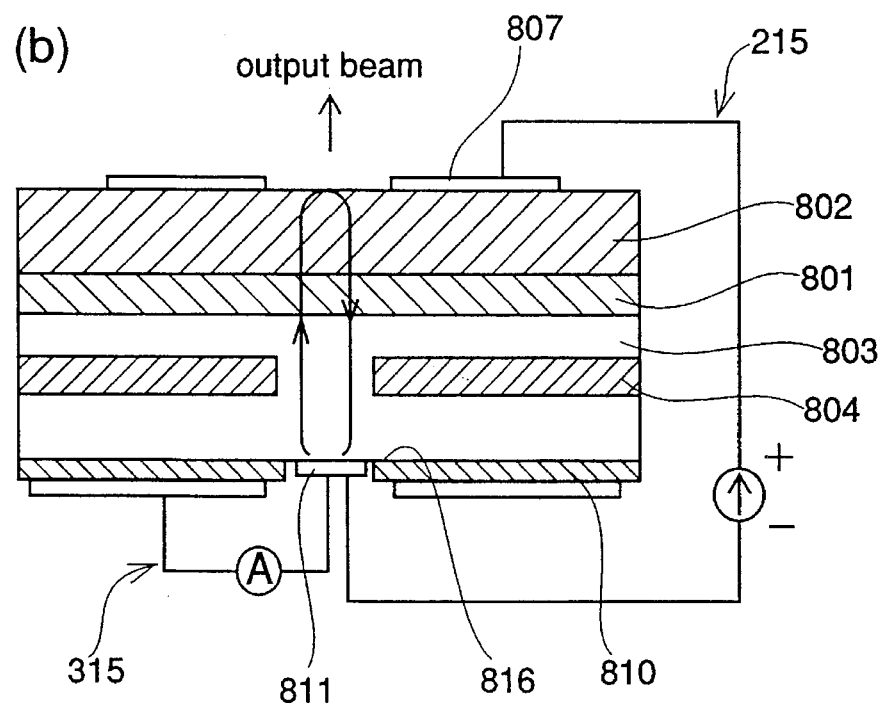

First of all, photodiode-containing surface emitting laser diodes are disclosed in Japanese Published Patent Application No. Sho. 63-95690 are shown in FIGS. 8(a) and 8(b). The surface emitting laser diodes 210 and 215 shown in FIGS. 8(a) and 8(b) include photodiodes 310 and 315, respectively. Each of the surface emitting laser diodes 210 and 215 comprises a cathode electrode 807, an n type cladding layer 802, an active layer 801, a p type cladding layer 803, a current blocking layer 804, and a respective anode electrode 814 and 811. A second surface 816 is perpendicular to the laser beam output direction. A light responsive pn junction is produced at the second surface 816 by the p type cladding layer 803 and the n type contact layer 810.

Although the laser structure according to the second and fourth embodiments of the invention is similar to the above-described prior art laser diode, the laser of the present invention is a facet emitting laser whereas the prior art laser diode is a surface emitting laser diode.

Figure 9:
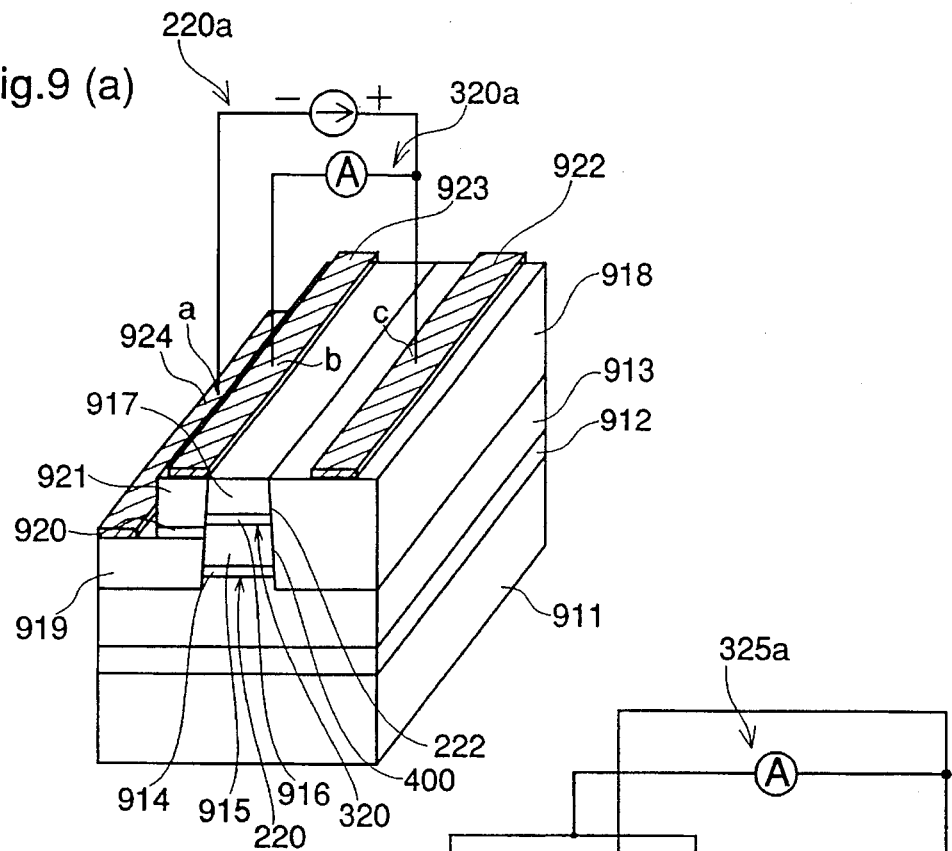
FIGS. 9(a) and 9(b) are sectional views illustrating prior art laser devices disclosed in Japanese Published Patent Application No. Hei. 4-163983.
Figure 9:
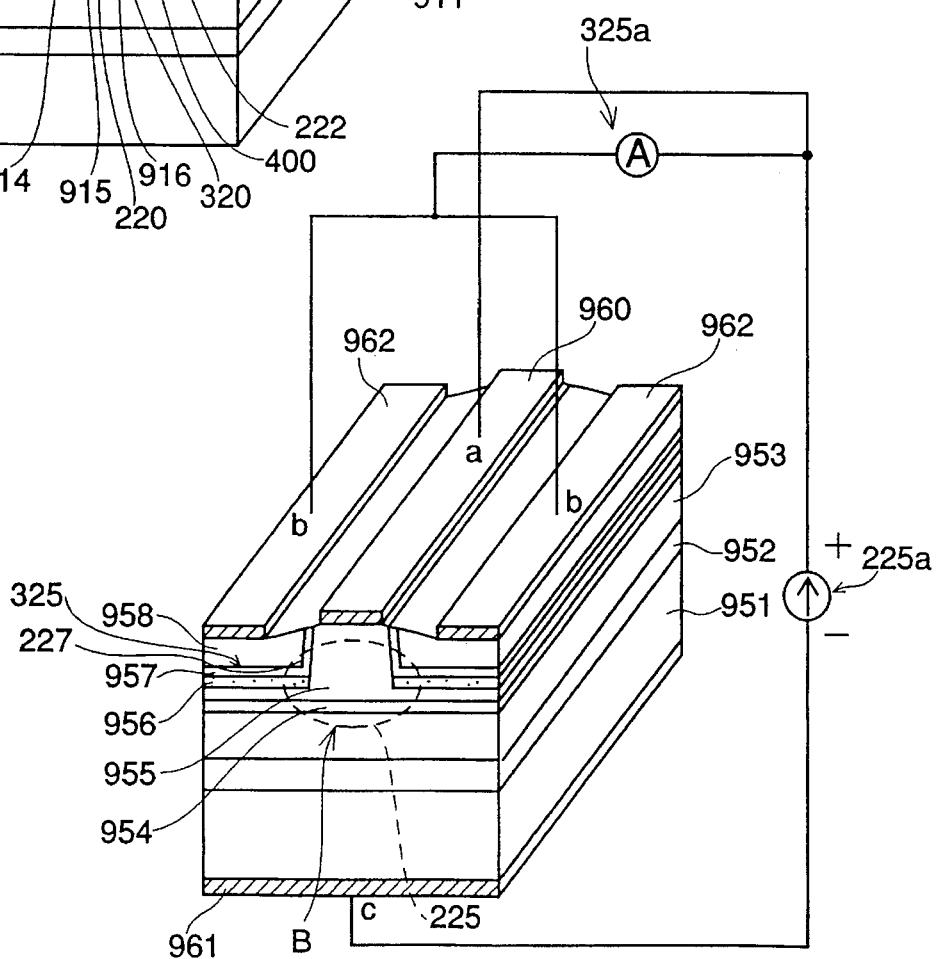

FIG. 9(a) shows a facet light input and output amplifier containing a photodiode disclosed in Japanese Published Patent Application No. Hei. 4-163983. The amplifier shown in FIG. 9(a) comprises a GaAs substrate 911, a semi-insulating buffer layer 912, a semi-insulating cladding layer 913, an active layer 914, a semi-insulating cladding layer 915, a light absorption layer 916, a semi-insulating cladding layer 917, a p type cladding layer 918, a first n type cladding layer 919, a high resistivity layer 920, a second n type cladding layer 921, a p side electrode 922, and n side electrodes 923 and 924, wherein an active region 220 serving as a laser diode (LD) comprises the active layer 914 and a light responsive region 320 serving as a photodiode (PD) comprises the light absorption layer 916. Reference numeral 220a designates a drive circuit for the LD, and numeral 320a designates a detector circuit for the PD.

In production, the semi-insulating buffer layer 912, the semi-insulating cladding layer 913, the active layer 914, the semi-insulating cladding layer 915, the light absorption layer 916, and the semi-insulating cladding layer 917 are successively grown on the GaAs substrate 911. Thereafter, the laminated structure is selectively etched to form a mesa, and the p side cladding layer 918 is grown on a side (right side in FIG. 9(a)) of the mesa structure while the first n type cladding layer 919, the high resistivity layer 920, and the second n type cladding layer 921 (n type —semi-insulating type—n type) are grown on the other side (left side) of the mesa. The LD 220 and the PD 320 are included in the same waveguide.

The LD 220 and the PD 320 are controlled separately, and the drive current of the LD 220 is controlled in response to the photocurrent of the PD 320.

PN junctions 222 on the opposite sides of the stripe-shaped mesa structure at the light absorption layer 916 function as the PD 320.

A description is given of the operation.

When a forward bias is applied across c-a, carriers are injected into the LD 220, and laser oscillation occurs. Laser light produced in the LD 220 passes through the semi-insulating cladding layer 915 and reaches into the PD 320, and so-called mode locking of laser light occurs. In this laser structure, there is no idea of detecting leakage light, but the LD 220 and the PD 320 have competitive light distributions, i.e., the LD 220 and the PD 320 are formed in the same waveguide.

On the other hand, when a reverse bias is applied across c-b, a photocurrent flows in response to the intensity of the laser light, so that the PD 320 effectively detects the intensity of the laser light.

Furthermore, FIG. 9(b) shows a ridge structure laser diode disclosed in Japanese Published Patent Application No. Hei. 4-163983. This laser diode includes a current blocking structure comprising a semi-insulating layer, a light responsive region, and an n type layer.

More specifically, this laser structure shown in FIG. 9(b) includes an n type GaAs substrate 951, an n type buffer layer 952, an n type cladding layer 953, an active layer 954, a p type cladding layer 955, a high resistivity layer 956, a light absorption layer 957, an n type cladding layer 958, a p side electrode 960, and n side electrodes 962, wherein an active region 225 serving as an LD comprises the active layer 954 and a light responsive region 325 serving as a PD comprises the light absorption layer 957. Reference numerals 225a designates a drive circuit for the LD, and numeral 325a designates a detector circuit for the PD.

In production, the semi-insulating buffer layer 952, the semi-insulating cladding layer 953, the active layer 954, and the p type cladding layer 955 are successively grown on the n type GaAs substrate 951. Thereafter, the laminated structure is selectively etched to form a mesa structure, and the high resistivity layer 956, the light absorption layer 957, and the n type cladding layer 958 are grown on opposite sides of the mesa structure.

The LD 225 and the PD 325 are controlled separately, and the drive current of the LD 225 is controlled in response to the photocurrent of the PD 325. PN junctions 227 are produced between the n type cladding layer 958 and opposite sides of the mesa structure comprising the p type cladding layer 955, thereby providing the PD 325. In this structure, the LD 225 and the PD 325 are included in the same waveguide.

In operation, when a forward bias is applied across a-c while a reverse bias is applied across a-b, laser oscillation occurs in the active layer 954, and laser light having a distribution B is generated and absorbed by the PD 325. Therefore, the light absorption in the current blocking structure comprising the high resistivity layer 956, the light absorption layer 957, and the n type cladding layer 958 restricts the distribution of the laser light in the LD 225, whereby the mode of the laser light is locked. That is, the PD 325 and the LD 225 in which the laser light is generated are included in the same waveguide.

On the other hand, in the laser structure according to the third embodiment of the invention shown in FIG. 3, the n type region 31 functioning as a PD is not included in the ridge 6 but included in the contact layer 7 on the ridge 6.

In operation, when a forward bias is applied across a-c while a reverse bias is applied across a-b, current flows as shown by the arrows 34, and laser light is generated in the active layer 3. However, in the laser structure shown in FIG. 3, not the LD light but the leakage light 35 from EL (electroluminescence) light that is generated due to electron and hole recombination and reaches the pn junction in the contact layer 7, and the pn junction functions as a monitor PD.

The laser structure according to the present invention in which the active region (LD) and the light responsive region (PD) are located outside the waveguide is fundamentally different from the prior art structure in which the LD and PD are included in the waveguide.

A description is given of differences between the semiconductor laser device according to the present invention and the prior art laser devices shown in FIGS. 9(a) and 9(b).

In the prior art laser devices shown in FIGS. 9(a) and 9(b), since the LD and PD are included in the same waveguide, the PD adversely affects the distribution of laser light in the crystal layer. For example, in the structure shown in FIG. 9(a), since the PD 320 is within the distribution of the guided light, the PD 320 restricts the broadening angle of the emitted laser light. In the structure of FIG. 9(a), the angle is reduced. Since the influence of the PD on the laser light must be considered, the design margin is reduced. On the other hand, in the laser structure shown in FIG. 3 according to the invention, since the PD does not restrict the distribution of laser light, emitted laser light can be controlled regardless of the PD. Therefore, the design margin is increased, resulting in good yield.

In fabrication of the prior art laser structure shown into FIG. 9(a), the active region 220 is formed in a mesa by etching and, thereafter, the mesa is buried with the epitaxially grown layers 918 at the opposite sides 400. In this process, since the opposite sides 400 of the mesa are exposed to air and oxidized so that the crystallinity of the regrowth interface is degraded, resulting in poor reliability.

In addition, in the prior art structure, current is injected in the a direction transverse to the mesa structure. In this case, the concentration of injected carriers in the active layer 220 is not uniform. Especially the carrier concentration varies with a variation in temperature, whereby the laser emitting direction varies. In fact, we have never seen this prior art laser structure in practical use nor in experimental use, which means that this structure is impractical.

On the other hand, ridge structure laser diodes as described in the present invention are very practical and have been mass-produced.

Although the ridge structure laser device shown in FIG. 9(b) according to the prior art is also practical, it has the following drawbacks.

The crystallinity of the light responsive region 325 is very poor because that region includes the pn or pin junction at the bottom and the opposite sides of the ridge. That is, since the crystal growth for making the pn or pin junction is performed on at least two crystal planes, the atomic arrangement in the grown crystal layer is disordered. When a reverse bias of 0–30 V is applied to the light responsive region 325 to make that region function as a PD, current is generated in the crystal layer, thereby increasing the dark current. On the other hand, in the present invention, since the pn junction functioning as a light responsive region is formed on a flat surface, the crystallinity is good and the dark current is suppressed.

Figure 10:
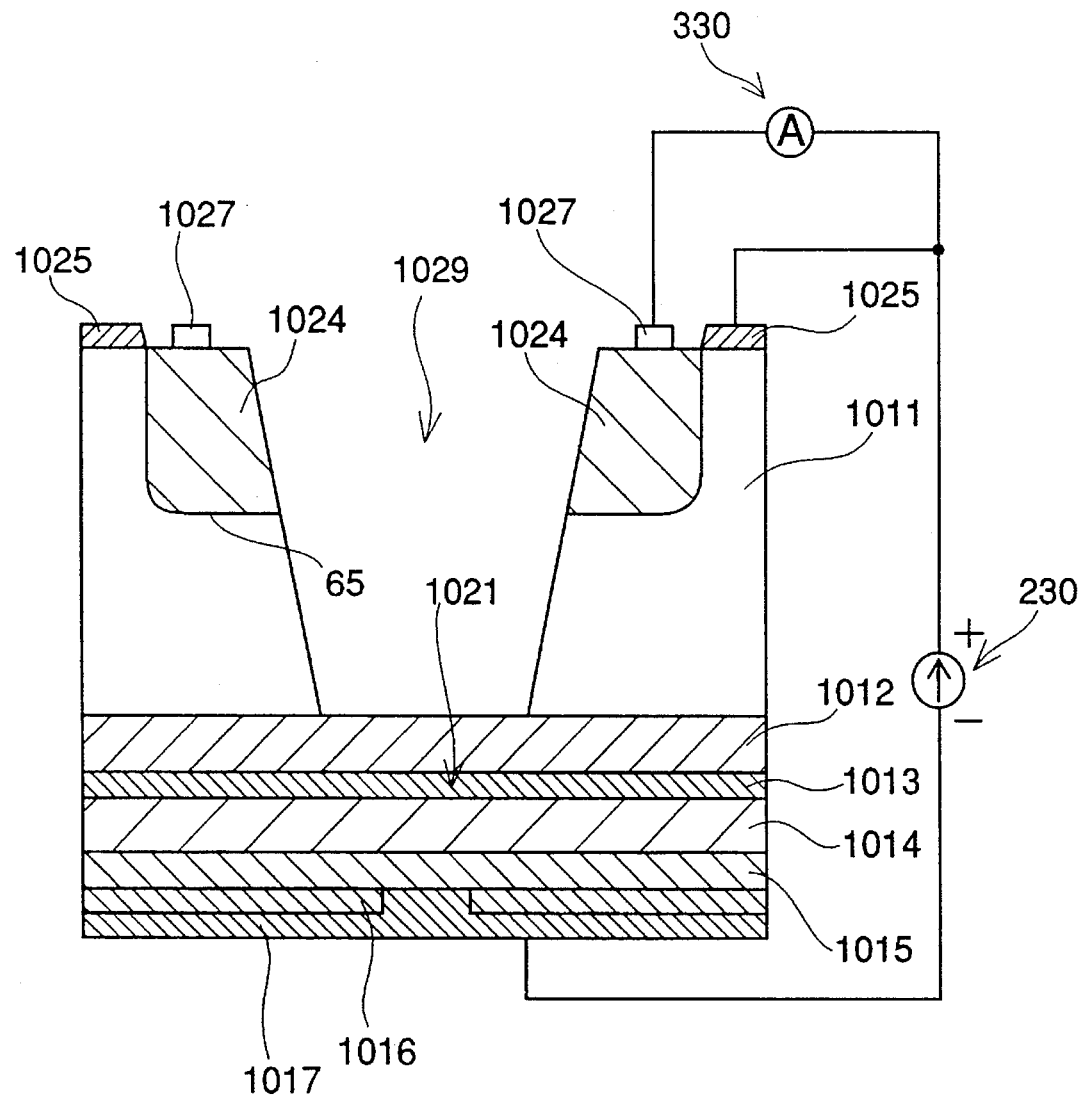
FIG. 10 is a sectional view illustrating a prior art laser device disclosed in Japanese Published Patent Application No. Sho. 61-220383.

FIG. 10 is a sectional view illustrating a facet light input and output type amplifier containing a photodiode, disclosed in Japanese Published Patent Application No. Sho. 61-220383.

In FIG. 10, the laser structure includes an n type semiconductor substrate 1011, an n type cladding layer 1012, a p type active layer 1013, a p type cladding layer 1014, a p type cap layer 1015, an $SiO_2$ film 1016 for current concentration, a light emitting region 1021, a p side ohmic electrode 1017 for the light emitting region, light responsive p type regions 1024, n side ohmic electrodes 1025 common to the light emitting region and the light responsive region, p side ohmic electrodes 1027 for the light responsive region, and a light output hole 1029. This laser diode is a surface emitting laser diode and has the light output hole 1029 on the rear surface. The emitted LD light is absorbed by pn junctions 65 in the opposite side walls of the hole 1029.

This prior art laser diode monitors LD light whereas the laser diode according to the present invention monitors leakage light from EL (electroluminescence) light that is generated due to electron and hole recombination and includes the LD light. Therefore, the laser diode according to the invention is fundamentally different from the prior art laser diode.

Figure 11:
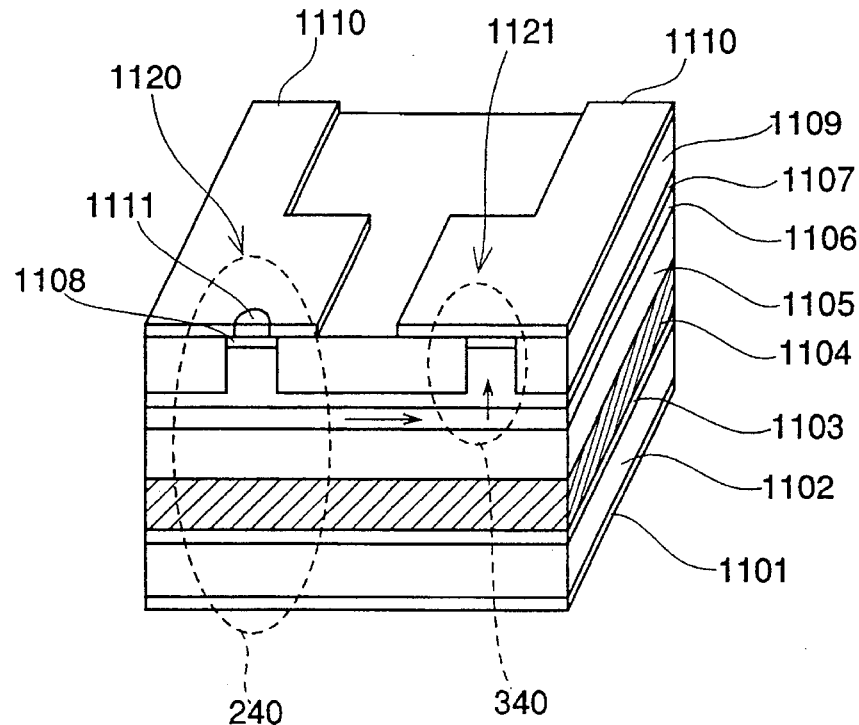
FIG. 11 is a sectional view illustrating a prior art laser device disclosed in Japanese Published Patent Application No. Hei. 5-251828.
Figure 12:
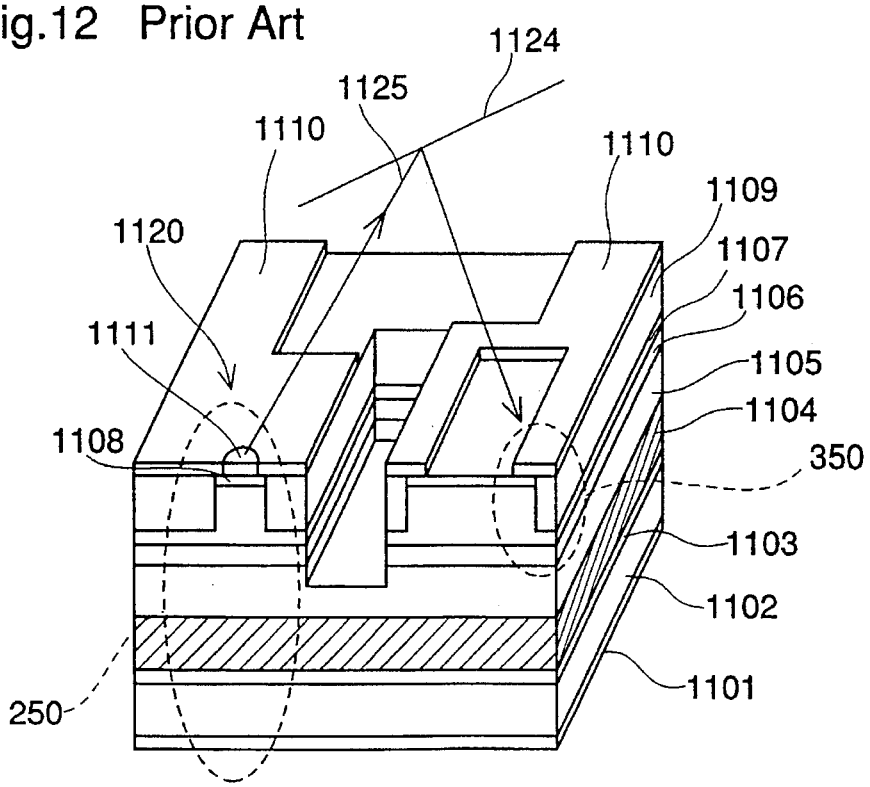
FIG. 12 is a sectional view illustrating a prior art laser device disclosed in Japanese Published Patent Application No. Hei. 5-299779.

FIGS. 11 and 12 are perspective views illustrating semiconductor lasers disclosed in Japanese Published Patent Applications. Nos. Sho. 5-251828 and Hei. 5-299779, respectively.

The laser device shown in FIG. 11 includes a laser diode 240 and a photodiode 340, and the laser device shown in FIG. 12 includes a laser diode 250 and a photodiode 350. Each laser structure includes an n side ohmic electrode 1101, an n type GaAs substrate 1102, an n type GaAs buffer layer 1103, a distributed feedback type multilayer mirror 1104, an n type $Al_{0.4}Ga_{0.6}As$ cladding layer 1105, a p type GaAs active layer 1106, a p type $Al_{0.4}Ga_{0.6}As$ cladding layer 1107, a p type $Al_{0.1}Ga_{0.9}As$ contact layer 1108, a $ZnS_{0.06}Se_{0.94}$ layer 1109, p side ohmic electrodes 1110, and a dielectric multilayer mirror 1111. In FIG. 12, reference numeral 1124 designates a mirror for reflecting laser light 1125. The LDs 240 and 250 are surface emitting LDs. A space between the LD 240 (250) and the PD 340 (350) is filled with the II–IV compound semiconductor layer, i.e., the $ZnS_{0.06}Se_{0.94}$ layer 1109.

Although the laser structure according to the fifth embodiment of the invention shown in FIG. 5 is similar to the prior art lasers shown in FIGS. 11 and 12, the structure shown in FIG. 5 is fundamentally different from those prior art structures in the following respects.

The laser structure shown in FIG. 5 has the grooves 63 that electrically separate the laser region 61 from the light responsive region 62 whereas the prior art structure shown in FIG. 11 does not have such grooves.

In the prior art laser device shown in FIG. 12, LD light is reflected by the mirror 1124 and applied to the PD 340. In the laser device shown in FIG. 5, however, EL light is directly monitored.

Further, laser devices according to the first to fourth embodiments of the invention are fundamentally different from the prior art laser device shown in FIG. 11. That is, in the prior art laser shown in FIG. 11, leakage light from the active layer 1106 of the LD 240 is transmitted through the active layer in the horizontal direction and detected by the PD 340. On the other hand, in the laser devices according to the first to fourth embodiments of the invention, leakage light from the light emitting region is directly monitored in the light responsive region just above the light emitting region.

Figure 13:
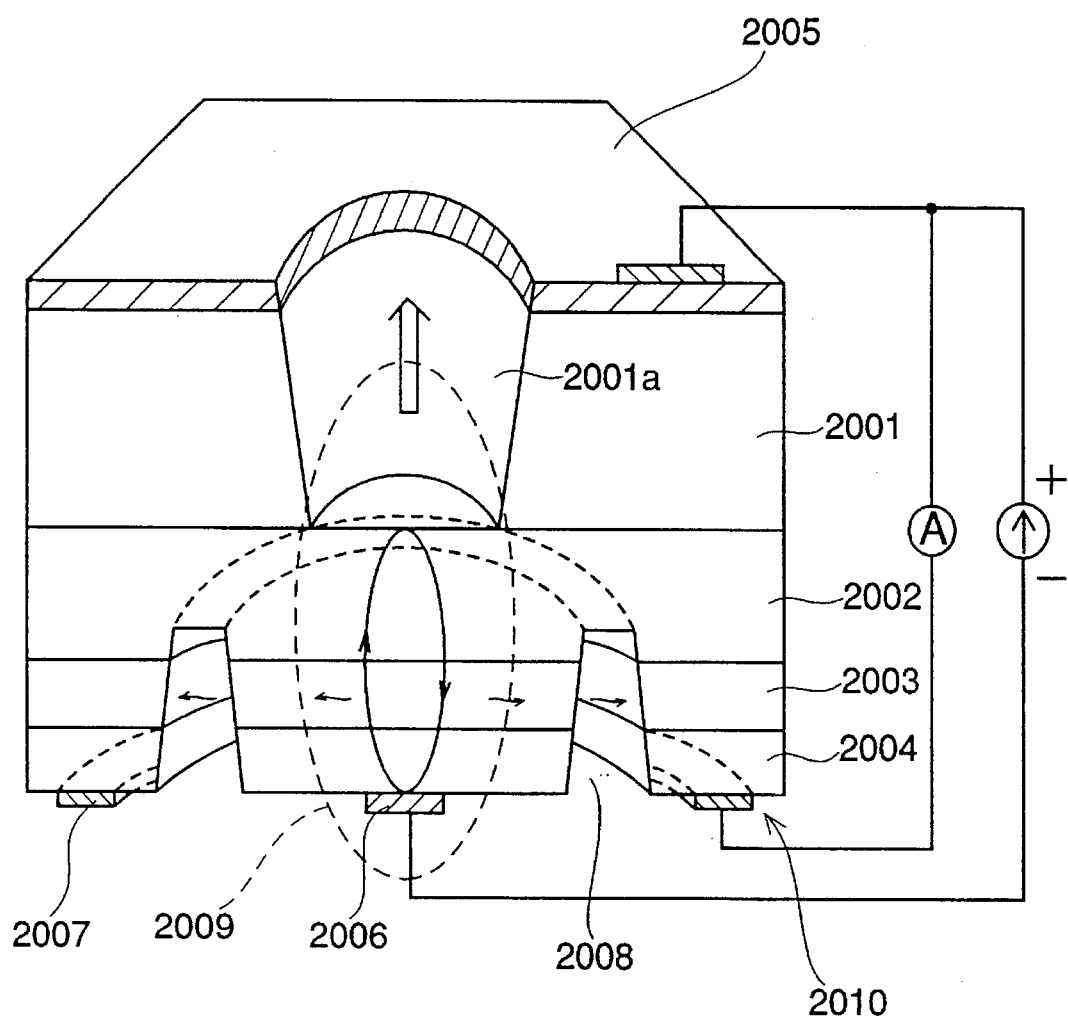
FIG. 13 is a sectional view illustrating a prior art laser device disclosed in Japanese Published Patent Application No. Sho. 62-15872.

FIG. 13 is a sectional view illustrating a semiconductor laser device disclosed in Japanese Published Patent Application No. Sho. 62-15872.

This prior art laser comprises a surface emitting laser diode (LD) 2009 and a photodiode (PD) 2010 surrounding the LD 2009. More specifically, the structure includes a substrate 2001, a hole 2001a penetrating through the substrate, a first cladding layer 2002, an active layer 2003, a second cladding layer 2004, a common electrode 2005, a mirror electrode 2006, an annular electrode 2007, and grooves 2008. The LD 2009 and the PD 2010 are fabricated simultaneously. The groove 2008 separates the LD 2009 from the PD 2010. Leakage light from the LD 2009 is detected by the PD 2010.

The laser structure shown in FIG. 5 according to the fifth embodiment of the invention is similar to the prior art laser structure shown in FIG. 13. However, in the laser structure according to the invention, the light responsive regions 62 are located on opposite sides of the facet emitting laser diode 61 whereas the surface emitting LD 2009 is surrounded by the PD 2010 in the prior art structure.

What is claimed is:

1. A semiconductor laser device comprising:

opposite resonator facets formed by cleaving;

a semiconductor region of a first conductivity type;

a semiconductor multilayer structure disposed on the first conductivity type semiconductor region and comprising at least an active layer and upper and lower cladding layers sandwiching the active layer, the semiconductor multilayer structure functioning as a laser;

first and second electrodes for supplying current to the semiconductor multilayer structure to generate light in the structure;

a semiconductor region of a second conductivity type, opposite the first conductivity type, contacting the semiconductor region of the first conductivity type to produce a pn junction and disposed relative to the semiconductor multilayer structure so that the light generated in the semiconductor multilayer structure is directly applied to the semiconductor region of the second conductivity type; and a third electrode electrically contacting the semiconductor region of the second conductivity type for outputting signals when a voltage is applied between the third electrode and either the first electrode or the second electrode.

2. The semiconductor laser device of claim 1 wherein:

the semiconductor region of the first conductivity type comprises a first conductivity type semiconductor substrate having opposite first and second surfaces;

the semiconductor multilayer structure functioning as a laser is disposed on the first surface of the first conductivity type semiconductor substrate;

the semiconductor region of the second conductivity type is disposed within the first conductivity type semiconductor substrate, reaching the second surface of the substrate; and the first conductivity type semiconductor substrate and the second conductivity type region produce a pn junction parallel to the first surface of the semiconductor substrate.

3. The semiconductor laser device of claim 2 wherein:

the first conductivity type semiconductor substrate comprises n type GaAs;

the semiconductor multilayer structure comprises an n type AlGaAs lower cladding layer, a p type AlGaAs active layer, and a p type AlGaAs upper cladding layer; and including a stripe-shaped ridge comprising a portion of the p type AlGaAs upper cladding layer;

an n type GaAs current blocking layer disposed on the p type AlGaAs upper cladding layer and contacting opposite sides of the ridge;

a p type GaAs contact layer disposed on the ridge of the p type AlGaAs upper cladding layer and on the n type GaAs current blocking layer and wherein the semiconductor region of the second conductivity type is a p type region disposed within the n type GaAs substrate opposite the ridge and reaching the second surface of the substrate;

the first electrode is a p side electrode disposed on the p type GaAs contact layer;

the second electrode is a pair of electrodes disposed on the second surface of the n type GaAs substrate at opposite sides of and spaced apart from the p type region; and the third electrode is a p side electrode disposed on the p type region.

4. The semiconductor laser device of claim 1 wherein:

the semiconductor region of the second conductivity type comprises a second conductivity type semiconductor substrate having opposite first and second surfaces;

the semiconductor region of the first conductivity type comprises a first conductivity type light absorption layer disposed on the first surface of the semiconductor substrate and a first conductivity type buffer layer disposed on the light absorption layer;

the semiconductor multilayer structure is disposed on the buffer layer;

one of the first and second electrodes is disposed on the buffer layer at the first surface of the semiconductor substrate where the light absorption layer is present, on opposite sides of and spaced apart from the light absorption layer; and the third electrode is disposed on the second surface of the second conductivity type semiconductor substrate.

5. The semiconductor laser device of claim 4 wherein:

the second conductivity type semiconductor substrate comprises p type GaAs;

the first conductivity type light absorption layer comprises n type GaAs;

the first conductivity type buffer layer comprises n type GaAs;

the semiconductor multilayer structure comprises a p type AlGaAs upper cladding layer, a p type AlGaAs active layer, and an n type AlGaAs lower cladding layer contacting the n type GaAs buffer layer and including a stripe-shaped ridge comprising a portion of the p type AlGaAs upper cladding layer, an n type GaAs current blocking layer disposed on the p type AlGaAs upper cladding layer and contacting opposite sides of the ridge, and a p type GaAs contact layer disposed on the ridge of the p type AlGaAs upper cladding layer and on the n type GaAs current blocking layer wherein the first electrode is disposed on the p type GaAs contact layer;

the second electrode is a pair of electrodes disposed on the n type GaAs buffer layer at opposite sides of and spaced apart from the n type light absorption layer; and the third electrode is disposed on the second surface of the p type GaAs substrate.

6. The semiconductor laser device of claim 5 wherein the n type GaAs light absorption layer has a carrier concentration no higher than $1 \times 10^{18}$ cm$^{-3}$.

7. The semiconductor laser device of claim 1 including:

a second conductivity type semiconductor substrate having opposite first and second surfaces wherein:

the semiconductor multilayer structure functioning as a laser is disposed on the first surface of the second conductivity type semiconductor substrate;

the semiconductor region of the first conductivity type comprises a first conductivity type contact layer disposed on the semiconductor multilayer structure and having a surface;

the semiconductor region of the second conductivity type is disposed within the first conductivity type contact layer and reaches the surface of the contact layer; and the first conductivity type contact layer and the semiconductor region of the second conductivity type produce a pn junction perpendicular to a direction of laser light emission.

8. The semiconductor laser device of claim 7 wherein:

the first conductivity type semiconductor substrate comprises n type GaAs;

the semiconductor multilayer structure comprises an n type AlGaAs lower cladding layer, a p type AlGaAs active layer, and a p type AlGaAs upper cladding layer; and including a stripe-shaped ridge comprising a portion of the p type AlGaAs upper cladding layer;

an n type GaAs current blocking layer disposed on the p type AlGaAs upper cladding layer and contacting opposite sides of the ridge; and a first conductivity type contact layer comprising p type GaAs and disposed on the ridge of the p type AlGaAs upper cladding layer and on the n type GaAs current blocking layer wherein the semiconductor region of the second conductivity type is an n type region disposed within the p type GaAs contact layer and reaches the surface of the contact layer;

the first electrode is disposed on the n type GaAs substrate;

the second electrode is a pair of electrodes disposed on the surface of the p type GaAs contact layer at opposite sides of and spaced apart from the n type region; and the third electrode is disposed on the n type region.

9. The semiconductor laser device of claim 1 including:

a second conductivity type semiconductor substrate having opposite first and second surfaces wherein:

the semiconductor multilayer structure functioning as a laser is disposed on the first surface of the second conductivity type semiconductor substrate;

the semiconductor region of the first conductivity type comprises a first conductivity type first contact layer disposed on the semiconductor multilayer structure and a first conductivity type light absorption layer disposed on a central region of the first contact layer;

the semiconductor region of the second conductivity type comprises a second conductivity type second contact layer disposed on the first conductivity type light absorption layer;

the first electrode is disposed on the second surface of the second conductivity type semiconductor substrate;

the second electrode is disposed on the first conductivity type first contact layer at opposite sides of and spaced apart from the light absorption layer; and the third electrode is disposed on the second conductivity type second contact layer.

10. The semiconductor laser device of claim 9 wherein:

the second conductivity type semiconductor substrate comprises n type GaAs;

the semiconductor multilayer structure comprises an n type AlGaAs lower cladding layer, a p type AlGaAs active layer, and a p type AlGaAs upper cladding layer; and including a stripe-shaped ridge comprising a portion of the p type AlGaAs upper cladding layer;

an n type GaAs current blocking layer disposed on the p type AlGaAs upper cladding layer and contacting opposite sides of the ridge wherein:

the first conductivity type first contact layer comprises p type GaAs and is disposed on the ridge of the p type AlGaAs upper cladding layer and on the n type GaAs current blocking layer;

the first conductivity type light absorption layer comprises p type GaAs;

the second conductivity type second contact layer comprises n type GaAs;

the first electrode is disposed on the second surface of the n type GaAs substrate;

the second electrode is a pair of electrodes disposed on the p type first contact layer at opposite sides of and spaced apart from the p type light absorption layer; and the third electrode is an n side electrode disposed on the n type second contact layer.

* * * * *